US009592666B2

(12) United States Patent
Bush et al.

(10) Patent No.: US 9,592,666 B2
(45) Date of Patent: *Mar. 14, 2017

(54) MATERIAL DISPENSING SYSTEM AND METHODS

(71) Applicant: The Procter & Gamble Company, Cincinnati, OH (US)

(72) Inventors: Stephan Gary Bush, Liberty Township, OH (US); Faiz Feisal Sherman, Mason, OH (US); Stephan James Andreas Meschkat, Bad Soden (DE); Thomas Elliot Rabe, Baltimore, MD (US)

(73) Assignee: The Procter & Gamble Company, Cincinnati, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/748,342

(22) Filed: Jun. 24, 2015

(65) Prior Publication Data

US 2015/0290670 A1 Oct. 15, 2015

Related U.S. Application Data

(63) Continuation-in-part of application No. 14/228,567, filed on Mar. 28, 2014.

(51) Int. Cl.

*H01L 21/20* (2006.01)
*B41J 2/045* (2006.01)

(Continued)

(52) U.S. Cl.

CPC ........... *B41J 2/0458* (2013.01); *B05B 12/004* (2013.01); *B05B 12/12* (2013.01); *B05B 12/126* (2013.01);

(Continued)

(58) Field of Classification Search

CPC B05C 5/02; B05B 3/00; B05B 12/004; B05B 12/12; B05B 12/126; B41J 2/00;

(Continued)

(56) References Cited

U.S. PATENT DOCUMENTS 4,431,690 A * 2/1984 Matt ...................... B41F 31/08 118/324
5,396,274 A 3/1995 Ortquist et al.

(Continued)

FOREIGN PATENT DOCUMENTS

EP 1228810 A2 8/2002
WO WO 2011006933 A1 1/2011
WO WO 2012103048 A2 8/2012

OTHER PUBLICATIONS

International Search Report and Written Opinion dated Jul. 17, 2015, 9 pgs.

*Primary Examiner* — Kevin M Picardat
(74) *Attorney, Agent, or Firm* — David K Mattheis

(57) ABSTRACT

A system and method for dispensing a fluid within an environment. The method includes the steps of: providing a dispensing system within an environment; discharging fluid from the dispensing system at a first, non-zero rate; detecting a change in the environment; and discharging fluid at a second rate after detecting the environmental change. The system comprises: a MEMS element coupled to a fluid reservoir and adapted to dispense fluid at a plurality of non-zero rates; at least one sensor; and a controller in communication with the MEMS element and at least one sensor and adapted to receive an output from the sensor and to alter the dispensing rate of the MEMS element according to the sensor output.

9 Claims, 1 Drawing Sheet

(51) Int. Cl.
*B05B 12/00* (2006.01)
*B05B 12/12* (2006.01)

(52) U.S. Cl.
CPC ....... *B41J 2/04553* (2013.01); *B41J 2/04571* (2013.01); *B41J 2/04581* (2013.01)

(58) Field of Classification Search
CPC .. B41J 2/04553; B41J 2/04571; B41J 2/0458; B41J 2/04581
USPC ........................................... 438/50, 500, 758
See application file for complete search history.

(56) References Cited

U.S. PATENT DOCUMENTS

| | | | | |
|---|---|---|---|---|
| 5,622,747 | A * | 4/1997 | Todd ...................... | B05D 1/265<br>118/410 |
| 6,543,893 | B2 | 4/2003 | Desormeaux | |
| 8,027,505 | B2 | 9/2011 | Edgar et al. | |
| 2009/0025747 | A1 | 1/2009 | Edgar et al. | |
| 2009/0179081 | A1 | 7/2009 | Charpie | |
| 2015/0086723 | A1 | 3/2015 | Buestgens | |

* cited by examiner

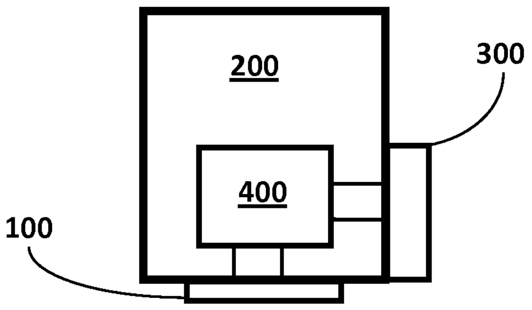
200
300
400
100

MATERIAL DISPENSING SYSTEM AND METHODS

FIELD OF THE INVENTION

The invention relates to systems and methods for dispensing materials. The invention relates particularly to systems and method for the targeted dispensing of materials.

BACKGROUND OF THE INVENTION

Systems for the dispensing of materials are well known. Spraying, printing and other technologies are known for the transfer of a material from a reservoir to a target Idecocation. Known systems provide a mechanism for the application of materials to surfaces, and also provide for the precise application of materials to targeted locations upon surfaces. Typical known systems tend to be of industrial scale with an intention of mass producing the target deposition or a customized targeted deposition. What is needed is a superior system and method for the targeted dispensing of materials into an environment at an individualized scale suited to personal use.

SUMMARY OF THE INVENTION

In one aspect, the invention comprises a method for dispensing fluid into an environment. The method includes the steps of: providing a system in an environment; discharging fluid from the dispensing system at a first, non-zero rate; detecting a change in the environment; and discharging fluid at a second rate as or after detecting the environmental change. In another aspect, the invention includes a system which comprises: a MEMS element coupled to a fluid reservoir and adapted to dispense fluid at a plurality of non-zero rates; at least one sensor; and a controller in communication with the MEMS element and at least one sensor and adapted to receive an output from the sensor and to alter the dispensing rate of the MEMS element according to the sensor output.

BRIEF DESCRIPTION OF THE DRAWINGS

The FIGURE provides a schematic representation of one embodiment of the invention.

DETAILED DESCRIPTION OF THE INVENTION

In one embodiment, the invention comprises a system for depositing a fluid or fluidized material upon a target surface. The system comprises a Micro Electro Mechanical System (MEMS) element coupled to one or more reservoirs. Exemplary MEMS elements include thermal drop-on-demand print heads (also referred to in the art as bubble jet or thermal inkjet print heads), and piezo drop-on-demand print heads.

The MEMS element may consist of a plurality of nozzles and the plurality of nozzles may be controlled independently so as to allow the rate of deposition or dispensing of fluid from each of the nozzles to be selected without regard to the rates associated with other nozzles. Sets of nozzles may be controlled as groups and the collection of nozzles of the MEMS element may be considered as a plurality of sets of nozzles such that each set represents a portion of the element. The respective portions may be operated at differing frequencies as necessary or desired. IN this manner, one portion of the element may be operated at a low frequency while a different portion is concurrently operated at another frequency. The firing rates of the respective nozzles may be altered by altering the frequency of the signal applied to the nozzles or by sending bit strings into an active addressing circuit that contains nozzle number and frequency of fire information. A controller contained within the system and in communication with the MEMS element may adjust the firing frequency and the firing order of respective nozzles according to preconfigured setting in the controller firmware or software and may also be associated with inputs from one or more sensors. The firing frequency may be preselected as specific values to provide a step function set of firing frequencies, or the frequency may be preconfigured to vary continuously within a predefined range according to one or more controller input values. Exemplary MEMS elements including the dispensing and control elements may be obtained from Hewlett-Packard, Fujifilm, Fuji, Canon, Seiko Epson, ST Microelectronics, MEMJET, or Texas Instruments.

One or more sensors may be included in the system for the purpose of providing information pertaining to the environment surrounding the dispensing system. Exemplary environmental factors of interest include: temperature and humidity, light, the presence of an artificial or natural substrate, relative motion between the dispensing system MEMS element and a substrate, the presence and proximity of the substrate, acceleration with respect to the surroundings, orientation with respect to magnetic or gravitational fields, topographic or otherwise discernible features of the substrate, and combinations of these.

Corresponding sensors include: temperature and humidity sensors, substrate proximity sensors, system or substrate motion detection sensors, acceleration sensors, field sensors, feature recognition sensors including electromagnetic wave based sensors including: optical, infrared, ultraviolet, radiofrequency and ultrasonic sensors, and combinations of these.

An illumination system may be included to support or enable the sensor detection system. One embodiment of the invention comprises LED light sources emitting light at wavelengths visible to the human eye. Other light sources, corresponding to the range or wavelengths detectable by the sensor, may include sources emitting infrared and ultraviolet wavelengths and sources emitting at radiofrequency, ultrasonic, electromagnetic or combinations of these may be used.

The controller may receive input information from the one or more sensors relating to the environment of the dispensing system. The controller may alter the frequency of dispensing of the MEMS according to the input values as well as altering the dispensing to direct the dispensed fluid toward particular target locations upon a substrate, or into the atmosphere of the environment. In one embodiment, the controller may process inputs from a sensor associated with substrate feature recognition. Upon determining the presence and location of a predefined substrate feature, the controller may alter the dispensing of the MEMS to direct fluid toward the feature or the area in the vicinity of the feature. Altering the dispensing in this manner may result in the application of fluid upon, or near, the feature for the purpose of masking or modifying the appearance of the feature or otherwise affecting the feature via a functional active ingredient of the fluid. Exemplary controllers include members of the Sitara series of applications processors available from Texas Instruments, the Tiva series of microcontrollers available from Texas Instruments, the STM32 series of microcontrollers available from ST Microelectronics, Coppell, Tex. and the Vybrid series of applications processors available from Freescale Semiconductor, Austin, Tex.

In one embodiment, the dispensing system may be utilized as follows: the system may be turned on via a manual switch or by a change in state—such as being removed from a storage cradle. The cradle may service the dispensing system in terms of charging its battery and managing the maintenance of the MEMS element in terms of cleaning its nozzles by wiping or wetting or both and by collecting deposited media when running nozzle activation cycles. In one embodiment the cradle includes both functions and elements for charging and maintenance of the MEMS. In another embodiment the cradle serves the charging function while maintenance of the MEMS is provided by a separate removable cap. In yet another embodiment the dispensing system does not require a charging service since the power is provided do the system via cable.

The system may begin dispensing fluid at a first non-zero rate. Such dispensing may serve to prepare the MEMS element for further dispensing while also reducing fouling of the MEMS element.

Acting upon predetermined sensor input—such as the detection of a change in the environment of the system—the controller may alter the fluid dispensing rate of the MEMS. In one embodiment, the rate may be decreased to reduce the rate the fluid is introduced into the environment. Additional inputs—motion of the system within the environment, a change in the temperature, relative humidity or lighting of the environment—may result in the controller again altering the dispensing rate for purposes including maintaining the available status of the MEMS, or altering the fluid introduction rate. Exemplary applications include masking, or otherwise altering the purpose of the feature, or applying an active ingredient of the fluid upon or near the feature and combinations thereof, increasing the fluid dispensing rate in relation to the temperature or humidity, decreasing the rate as lighting levels drop—a possible indication that no one is present in the local environment.

Additional environmental changes may also be detected and may serve as a basis for additional changes in the dispensing rate of the fluid to a third non-zero rate or further non-zero rates of dispensing. In one embodiment, the system may cease dispensing completely as the transition from a first non-zero rate to a second non-zero rate progresses.

Exemplary fluids for use with the system include: cosmetics, polymerics, aqueous, non-aqueous, particle loaded, optical modifier, fillers, optical matchers, skin actives, nail actives, hair actives, oral care actives, anti-inflammatory, antibacterial, surfactant or surfactant containing active, fragrances, perfume materials and combinations thereof. Exemplary environments for the application of the dispensing system include: keratinous surfaces, woven surfaces, non-woven surfaces, porous surfaces, non-porous surfaces, wood, teeth, tongue, metallic, tile, fabric, air and combinations thereof.

In one embodiment, the fluid reservoir of the system may comprise a plurality of distinct reservoir, each of the plurality containing a different fluid and the MEMS element may comprise multiple elements wherein each element is in fluid communication with a different portion of the plurality of reservoirs. In this embodiment, the system may dispense a single fluid or a combination of fluids in association with different environmental conditions. The dispensing rates of any and all fluid may be subject to alteration and may change from one non-zero rate to another non-zero rate upon input from one or more sensors.

As shown in the FIGURE, a MEMS element 100, is coupled to a fluid reservoir 200. A sensor 300 is disposed adjacent to the reservoir and the MEMS element. A controller 400 is electrically coupled to the sensor 300 and the MEMS element 100.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for dispensing a fluid into an environment, comprising the steps of:
- a. providing a dispensing system within the environment;
- b. discharging fluid from the dispensing system at a first, non-zero rate;
- c. detecting a change in the environment;
- d. discharging fluid at a second rate after detecting the environmental change; and
- e. ceasing to discharge fluid for a predetermined amount of time between the first non-zero rate and the second non-zero rate.

2. The method according to claim 1 further comprising the steps of:
- f. detecting a second environmental change;
- g. discharging fluid from the dispensing system at a third, non-zero rate.

3. The method according to claim 1 wherein the fluid is selected from the group consisting of: cosmetics, polymerics, aqueous, non-aqueous, particle loaded and combination thereof.

4. A dispensing system comprising:
- a. a MEMS element coupled to at least one fluid reservoir and adapted to dispense fluid at a plurality of non-zero rates;
- b. at least one sensor;
- c. a controller in communication with the MEMS element and at least one sensor and adapted to receive an output from the sensor and to alter the dispensing rate of the MEMS element according to the sensor output.

5. The dispensing system according to claim 4 wherein the sensor output is associated with the environment of the dispensing system.

6. The dispensing system according to claim 4 wherein the sensor output is associated with movement of the dispensing system within the environment.

7. The dispensing system according to claim 1 wherein the fluid is a cosmetic fluid, composed of aqueous solvents, non-aqueous solvents, dyes, solid particles, soluble polymers and combination thereof.

8. A method for applying fluid on surfaces, comprising the steps of:

a. providing a dispensing system within an environment;
b. removing a cap protecting a dispensing system;
c. discharging fluid from the dispensing system at a first non-zero rate;
d. detecting a change in the environment of the dispensing system ;
e. discharging fluid at a second rate while the dispensing system is moving within the environment; and
f. ceasing to discharge fluid for a predetermined amount of time between the first non-zero rate and the second non-zero rate.

9. The method according to claim 1 wherein the fluid is a cosmetic fluid, composed of aqueous solvents, non-aqueous solvents, dyes, solid particles, soluble polymers and combination thereof.

* * * * *